US009318323B2

(12) United States Patent
Alptekin et al.

(10) Patent No.: US 9,318,323 B2
(45) Date of Patent: Apr. 19, 2016

(54) SEMICONDUCTOR DEVICES WITH GRAPHENE NANORIBBONS

(71) Applicant: INTERNATIONAL BUSINESS MACHINES CORPORATION, Armonk, NY (US)

(72) Inventors: Emre Alptekin, Wappingers Falls, NY (US); Viraj Y. Sardesai, Poughkeepsie, NY (US); Reinaldo A. Vega, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 104 days.

(21) Appl. No.: 14/057,166

(22) Filed: Oct. 18, 2013

(65) Prior Publication Data

US 2015/0108499 A1 Apr. 23, 2015

(51) Int. Cl.
*H01L 21/00* (2006.01)
*H01L 21/02* (2006.01)
*H01L 27/088* (2006.01)
*H01L 21/8234* (2006.01)
*B82Y 10/00* (2011.01)
(Continued)

(52) U.S. Cl.
CPC .......... *H01L 21/02529* (2013.01); *B82Y 10/00* (2013.01); *H01L 21/0237* (2013.01); *H01L 21/0245* (2013.01); *H01L 21/02447* (2013.01); *H01L 21/02507* (2013.01); *H01L 21/02516* (2013.01); *H01L 21/02527* (2013.01); *H01L 21/02587* (2013.01); *H01L 21/02609* (2013.01); *H01L 21/02664* (2013.01); *H01L 21/823431* (2013.01); *H01L 27/0886* (2013.01); *H01L 29/0673* (2013.01); *H01L 29/1606* (2013.01); *H01L 29/775* (2013.01); *H01L 29/7781* (2013.01)

(58) Field of Classification Search
CPC ... H01L 51/0036; H01L 515/44; H01L 51/52; H05K 1/095
USPC ..................... 438/105, 931; 257/77
See application file for complete search history.

(56) References Cited

U.S. PATENT DOCUMENTS 7,732,859 B2 6/2010 Anderson et al.
8,169,085 B2 5/2012 Akimoto et al.
(Continued)

FOREIGN PATENT DOCUMENTS

WO 2012145079 A1 10/2012

OTHER PUBLICATIONS

Yu Miyamoto et al., "Graphene Formation on a 3C-SiC (111) Thin Film Grown on Si (110) Substrate", e-J. Surf. Sci. Nanotech. vol. 7, 2009, pp. 311-313.
(Continued)

*Primary Examiner* — Andy Huynh
(74) *Attorney, Agent, or Firm* — Michael LeStrange; Andrew M. Calderon; Roberts, Mlotkowski, Safran & Cole PC

(57) ABSTRACT

Semiconductor devices with graphene nanoribbons and methods of manufacture are disclosed. The method includes forming at least one layer of Si material on a substrate. The method further includes forming at least one layer of carbon based material adjacent to the at least one layer of Si. The method further includes patterning at least one of the at least one layer of Si material and the at least one layer of carbon based material. The method further includes forming graphene on the patterned carbon based material.

19 Claims, 4 Drawing Sheets

(51) Int. Cl.
*H01L 29/775* (2006.01)
*H01L 29/06* (2006.01)
*H01L 29/16* (2006.01)
*H01L 29/778* (2006.01)

(56) References Cited

U.S. PATENT DOCUMENTS

| | | | |
|---|---|---|---|
| 8,304,760 | B2 | 11/2012 | Chen et al. |
| 2008/0188080 | A1* | 8/2008 | Furukawa et al. ............ 438/694 |
| 2010/0035186 | A1 | 2/2010 | Hong et al. |
| 2011/0042649 | A1 | 2/2011 | Duvall et al. |
| 2011/0089403 | A1 | 4/2011 | Woo et al. |
| 2012/0248414 | A1 | 10/2012 | Kim et al. |
| 2012/0261643 | A1 | 10/2012 | Cohen et al. |
| 2012/0313079 | A1 | 12/2012 | Song et al. |
| 2013/0127023 | A1* | 5/2013 | Zenasni ................. C23C 16/56 257/635 |

OTHER PUBLICATIONS

Qin Zhang et al., "Graphene Nanoribbon Tunnel Transistors", IEEE, 2008, pp. 1-3.
Jakub Kedzierski et al., "Epitaxial Graphene Transistors on SiC Substrates", IEEE, vol. 55, No. 8, Aug. 2008, pp. 2078-2085.
Gianluca Fiori et al., "Simulation of Graphene Nanoribbon Field-Effect Transistors", IEEE, vol. 28, No. 8, Aug. 2007, pp. 760-762.

* cited by examiner

US 9,318,323 B2

SEMICONDUCTOR DEVICES WITH GRAPHENE NANORIBBONS

FIELD OF THE INVENTION

The invention relates to semiconductor structures and, more particularly, to semiconductor devices with graphene nanoribbons and methods of manufacture.

BACKGROUND

An objective of semiconductor device manufacturing is to scale device dimensions in order to reduce channel resistance, and hence improve transconductance over previous technology nodes employing longer channel length. Unfortunately, due to the high electric field velocity saturation and/or increased Coulomb scattering due to higher body doping requirements, scaling of the devices has become ever more difficult in nanoscale Si channel devices.

In order to continue the scaling of the devices and in order to continue the increase in performance, strained silicon channels have been employed in semiconductor device manufacturing. The strain levels in the channel have been continuously increased to lower the channel resistance to meet the performance targets. However, this approach is also approaching saturation in mobility enhancement in Si technologies.

SUMMARY

In an aspect of the invention, a method comprises forming at least one layer of Si material on a substrate. The method further comprises forming at least one layer of carbon based material adjacent to the at least one layer of Si. The method further comprises patterning at least one of the at least one layer of Si material and the at least one layer of carbon based material. The method further comprises forming graphene on the patterned carbon based material.

In an aspect of the invention, a method comprises forming alternating layers of Si material and SiC material over a substrate. The method further comprises patterning the alternating layers of Si material and SiC material into one or more fin stacks. The method further comprises forming graphene nanoribbons about the SiC material of the fin stacks by annealing at a predetermined annealing temperature and time.

In an aspect of the invention, a structure comprises: one or more fins of alternating Si material and SiC material; graphene nanoribbons disposed about SiC material on each of the one or more fins; and a gate structure extending over the one or more fins.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structure, which comprises semiconductor devices with graphene nanoribbons of the present invention. In still further embodiments, a method in a computer-aided design system is provided for generating a functional design model of the semiconductor devices with graphene nanoribbons. The method comprises generating a functional representation of the structural elements of semiconductor devices with graphene nanoribbons.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to semiconductor devices with graphene nanoribbons and methods of manufacture. More specifically, the present invention implements a graphene nanoribbon transistor fabrication process to form graphene channels with sub-5 nm widths. Advantageously, the graphene channels provide the required bandgap for transistor functionality; that is, the present invention overcomes known problems in graphene technologies, e.g., zero bandgap which is not suitable to be used as transistor channel. Also, as an alternative to Si channels, graphene channels (mono or several layers of graphite) formed using the processes of the present invention provide extremely high carrier mobility on the order of 10,000 $cm^2/Vs$ (7× to 300× of that in silicon), as well as a planar structure for implementation in CMOS technology.

In embodiments, the structure of the present invention includes a plurality of multi layer stacks (FINS) to form FINFETs. The stacks each include alternating Si and SiC layers, with at least one nanoribbon disposed around each stack. By using the processes of the present invention, it is now possible to precisely control the graphene nanoribbon size by controlling an epitaxial (e.g., SiC) thickness. The processes of the present invention enable formation of graphene nanoribbons below 5 nm which is necessary for a reasonable band gap for transistor operation.

The fabrication of graphene nanoribbon transistors (FINFETS) of the present invention resembles FINFET transistor fabrication processes. For example, the semiconductor devices can be manufactured in a number of ways using a number of different tools. In general, the methodologies and tools are used to form small structures with dimensions in the micrometer scale. The methodologies, i.e., technologies, employed to manufacture semiconductor devices with graphene nanoribbons of the present invention have been adopted from integrated circuit (IC) technology. For example, the structures of the present invention are built on wafers and are realized in films of material patterned by photolithographic processes on the top of a wafer. In particular, the fabrication of the semiconductor devices uses basic building blocks, including: (i) deposition of thin films of material on a substrate, (ii) applying a patterned mask on top of the films by photolithographic imaging, (iii) etching the films selectively to the mask; and (iv) annealing the structure to form graphene nanoribbons.

Figure 1:
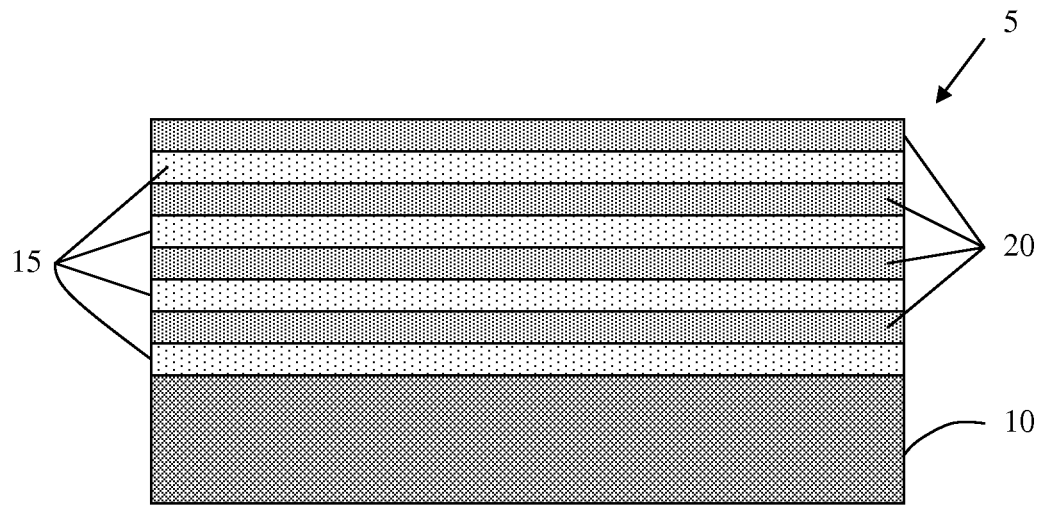
FIGS. 1-4 show processing steps and respective structures in accordance with aspects of the present invention.

More specifically, FIG. 1 shows processing steps and a respective structure in accordance with aspects of the present invention. The structure 5 includes a wafer 10. In embodiments, the wafer 10 may comprise a bulk silicon or silicon on insulator (SOI) wafer. In the SOI implementation, the wafer 10 comprises a semiconductor layer (e.g., active silicon) formed over an insulation layer. The constituent materials of the SOI wafer may be selected based on the desired end use application of the semiconductor device. For example, the buried insulation region (BOX) may be composed of oxide, such as $SiO_2$. Moreover, the semiconductor layer is not limited to silicon; instead, the semiconductor layer may be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

Still referring to FIG. 1, multiple layers of Si material 15 and SiC material 20 are deposited on the wafer 10, using conventional deposition processes, e.g., chemical vapor deposition (CVD). It should be understood that the present invention is not limited to the number of layers shown in FIG. 1, and that any number of alternating layers are contemplated by the present invention, e.g., one or more layers of each material.

In embodiments, the Si material 15 can be, for example, SiGe or other sacrificial materials. For example, the Si material 15 can be Si (110); although other common substrates can be implemented such as Si (111) or Si (100). The SiC material 20 can have an orientation of (111), with Si (110). In embodiments, the SiC material 20 can have a thickness of about 0.5 nm to 5 nm and more preferably about 1 nm to 5 nm and even more preferably about 2 nm to 3 nm; although other dimensions are contemplated by the present invention depending on the desired bandgap requirements. In embodiments, the thickness of the SiC material 20 will define a final graphene nanoribbon, with the total heterostructure thickness determined by the total active FIN height.

Figure 2:
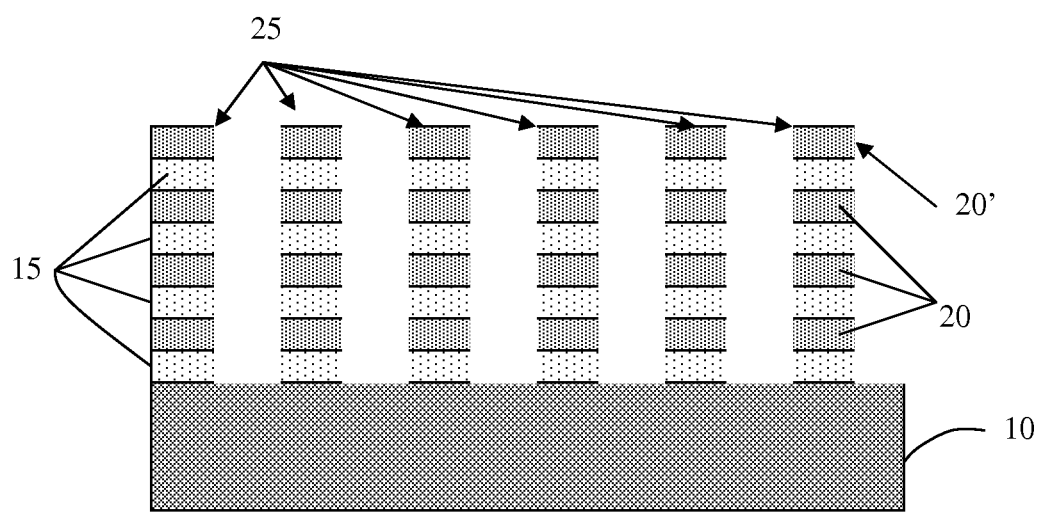

In FIG. 2, the multiple layers of Si material 15 and SiC material 20 are formed into respective stacks (e.g., FINs) 25. As an example, the FINs 25 can be formed using direct patterning or side wall image transfer (SIT) methods. More specifically, in the direct patterning process, after a resist is formed on the uppermost layer, e.g., SiC layer 20', it is exposed to energy (light) to form a pattern (openings). An etching process, e.g., reactive ion etching (RIE), is then performed through the openings to remove any exposed material. After the material is removed, the resist can be stripped using an oxygen ashing process, for example.

In a SIT process, on the other hand, a hardmask is formed and patterned on the uppermost layer, e.g., SiC layer 20'. Sidewalls are then formed on the sidewalls of the pattern (openings). The hardmask material is removed, leaving only the sidewalls (which is a smaller dimension than the patterned hardmask material). An etching process, e.g., reactive ion etching (RIE), is then performed on the exposed underlying material, with the sidewalls providing protection for the FIN structures 25. The sidewalls are then removed, leaving the FINs 25.

In embodiments, the FINs 25 can have a width of about 10 nm to about 30 nm; although other dimensions are also contemplated by the present invention. It should be understood by those of skill in the art that the width of the FINs 25 define the channel length of a FINFET. The length of each FIN 25 can be, for example, approximately a gate pitch×N gates formed on the FIN 25; although larger FINs are also contemplated by the present invention. The height of each FIN 25 is a function of the number and thickness of each layered material. For example, the total height of each FIN can be about 50 nm to 100 nm; although other dimensions are also contemplated by the present invention.

Figure 3:
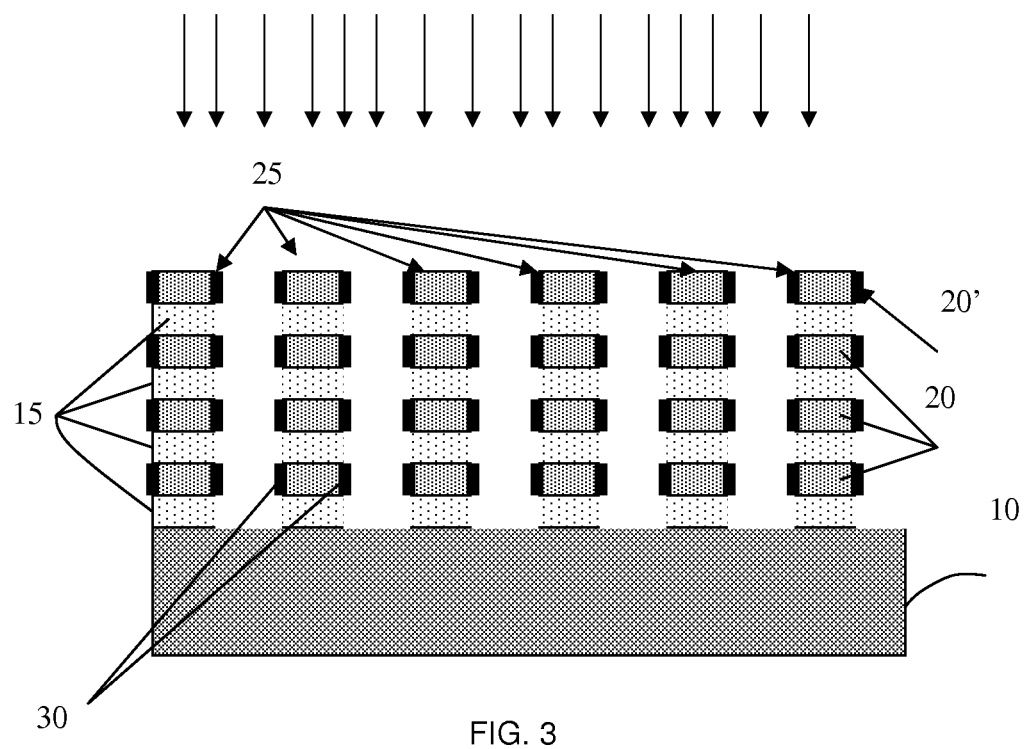

In FIG. 3, the FINs 25 undergo an annealing process to form graphene nanoribbons 30. In more specific embodiments, the graphene nanoribbons 30 are formed about each of the layers of SiC layers 20, 20' on each of the FINs 25. In embodiments, graphene formation occurs at a furnace anneal temperature of about of 1150° C. to about 1400° C. for about 30 to 300 minutes. This anneal will cause Si atoms to sublime and remaining carbon atoms in the SiC lattice to form honeycomb shape graphene layers 30. This process will grow mono or several layers of graphene on the SiC layers 20, 20', with the size of the graphene nanoribbons 30 being determined by the thickness of the SiC material 20. The number of graphene nanoribbons 30 is also determined by the initial number of layers of SiC material 20.

In embodiments, the graphene nanoribbons 30 can be tuned for device power/performance requirements. For example, by tuning the graphene nanoribbons 30, e.g., deposited different dimensions of SiC to form different sizes of graphene nanoribbons 30, it is possible to obtain different threshold voltage (Vt) using the same wafer. In this way, it is possible to provide an array of different band gaps. Illustratively, a 3 nm graphene nanoribbon has an approximate 0.46 eV bandgap; whereas, a 2 nm graphene nanoribbon has an approximate 0.6 eV bandgap.

Figure 4:
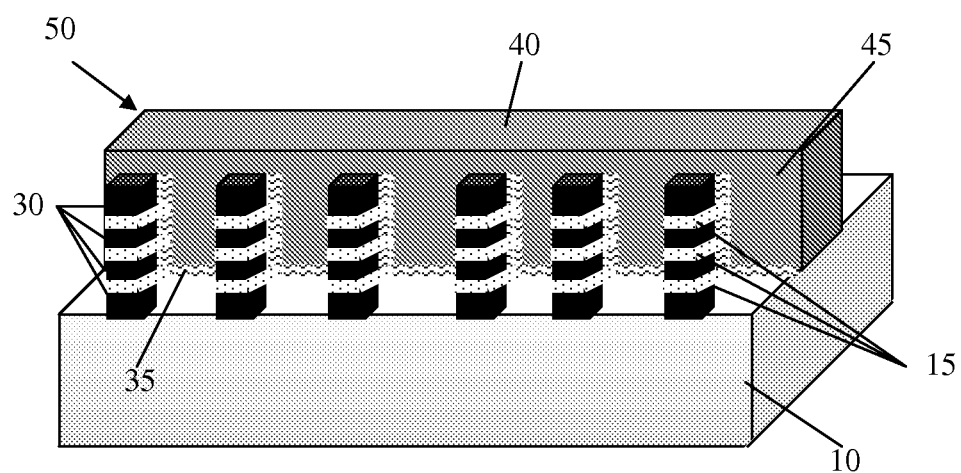

FIG. 4 shows illustrative, non-limiting gate formation processes in accordance with aspects of the present invention. The gate formation processes can be, for example, any known gate formation process, e.g., first or last gate processes. For example, in embodiments, an insulator material (e.g., dielectric layer) 35 can be blanket deposited on the FINs 25 and underlying substrate 10 using conventional CVD processes. The insulator material 35 can be, for example, a high-k dielectric material such as a hafnium based material, e.g., $HfO_2$, deposited to a thickness of about 10 Å to about 30 Å, and more preferably about 15 Å. However, other dielectric materials are also contemplated by the present invention such as, for example, oxide, silicon oxide, silicon oxynitride, silicon oxynitride, or any combinations thereof such as, for example, a stack of dielectric materials. The gate material 40 can be deposited on the dielectric material 35. The gate material 40 can be, for example, a polysilicon material or other metal material with certain work function properties, depending on the design specifications of the semiconductor device. The gate material 40 can be, for example, deposited to a thickness of about 10 Å to about 100 Å. In embodiments, the gate material 40 can be, for example, a metal (e.g., TiN or TaN) or poly material, deposited using conventional deposition methods, e.g., CVD. The dielectric material 35 and gate material 40 can then undergo a conventional lithography and etching process. Sidewalls 45, e.g., nitride, are deposited on the sides of the patterned structure to form the gate structures 50. Conventional source and drain processes, e.g., doping, ion implantation or insitu doped epitaxial layer deposition, are performed to form the source and drain regions. Source/drain contacts are formed in contact with the source/drain regions using conventional processes, e.g., etching and contact metal deposition processes.

In a replacement gate process (last gate process), a dummy gate structure is formed using conventional deposition and etching processes. Source and drain regions can then be formed using, for example, conventional ion implantation, doping or insitu doped epitaxial layer deposition processes. The dummy gate structure can then be removed, forming a trench within a dielectric material. Depending on the dummy gate process, sidewalls 45 can remain within the trench, and the trench is then filled with the dielectric material 35 and the metal gate material 40 to form the gate structure 50. As in any aspect of the invention, the metal gate material 40 can be, e.g., a stack of metal layers tailored to a specific work function for an NFET and a PFET. For example, the PFET metal gate stack may include a titanium nitride layer having a thickness of about 40 Å to about 100 Å following by a stack of Ti (20 Å to 50 Å) and aluminum; although, other metals with the same or different dimensions are also contemplated by the present invention.

Figure 5:
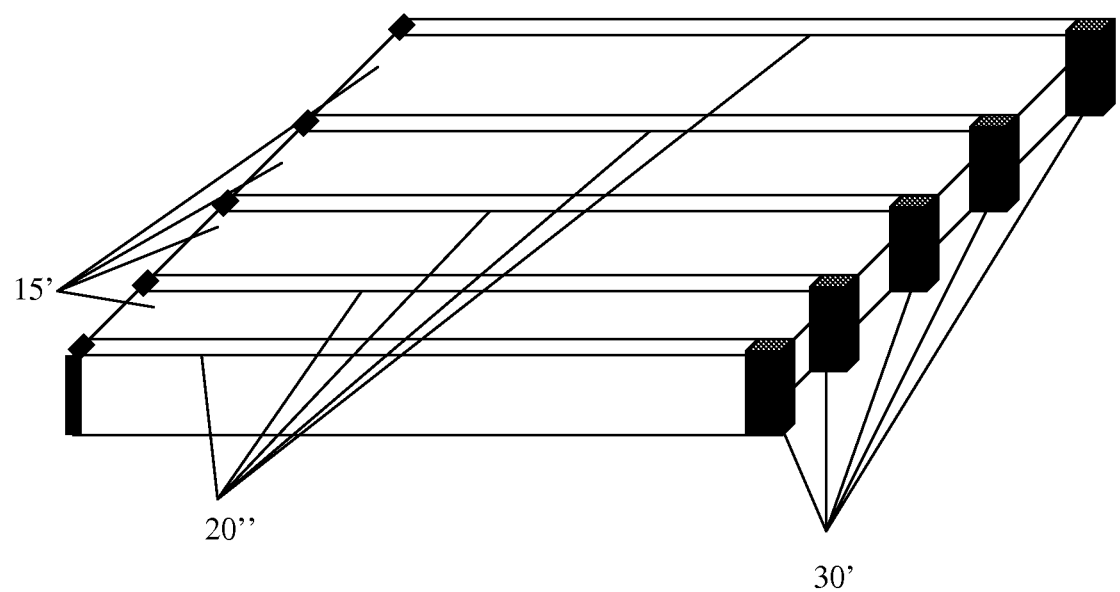
FIG. 5 shows processing steps and a respective structure in accordance with additional aspects of the present invention.

FIG. 5 shows an alternative structure and respective fabrication processes. In particular, FIG. 5 shows a planar structure with alternating Si material 15' and SiC material 20". In this embodiment, a plurality of trenches can be formed in the Si material 15' using conventional lithography and etching processes. SiC material 20" can then be deposited within the trenches using conventional CVD processes, for example. Any residual material can be removed using a chemical mechanical polishing. An anneal process, e.g., at a furnace anneal temperature of about of 1150° C. to to about 1400° C. for 30 to 300 minutes, is then performed to form graphene nanoribbons 30'. In this way, planar devices can be formed using the implementations of the present invention.

In an alternative method of manufacture, a plurality of trenches can be formed in the SiC material 20" using conventional lithography and etching processes. Si material 15' can then be deposited within the trenches using conventional CVD processes, for example. Any residual material can be removed using a chemical mechanical polishing. The anneal process can then be performed.

Figure 6:
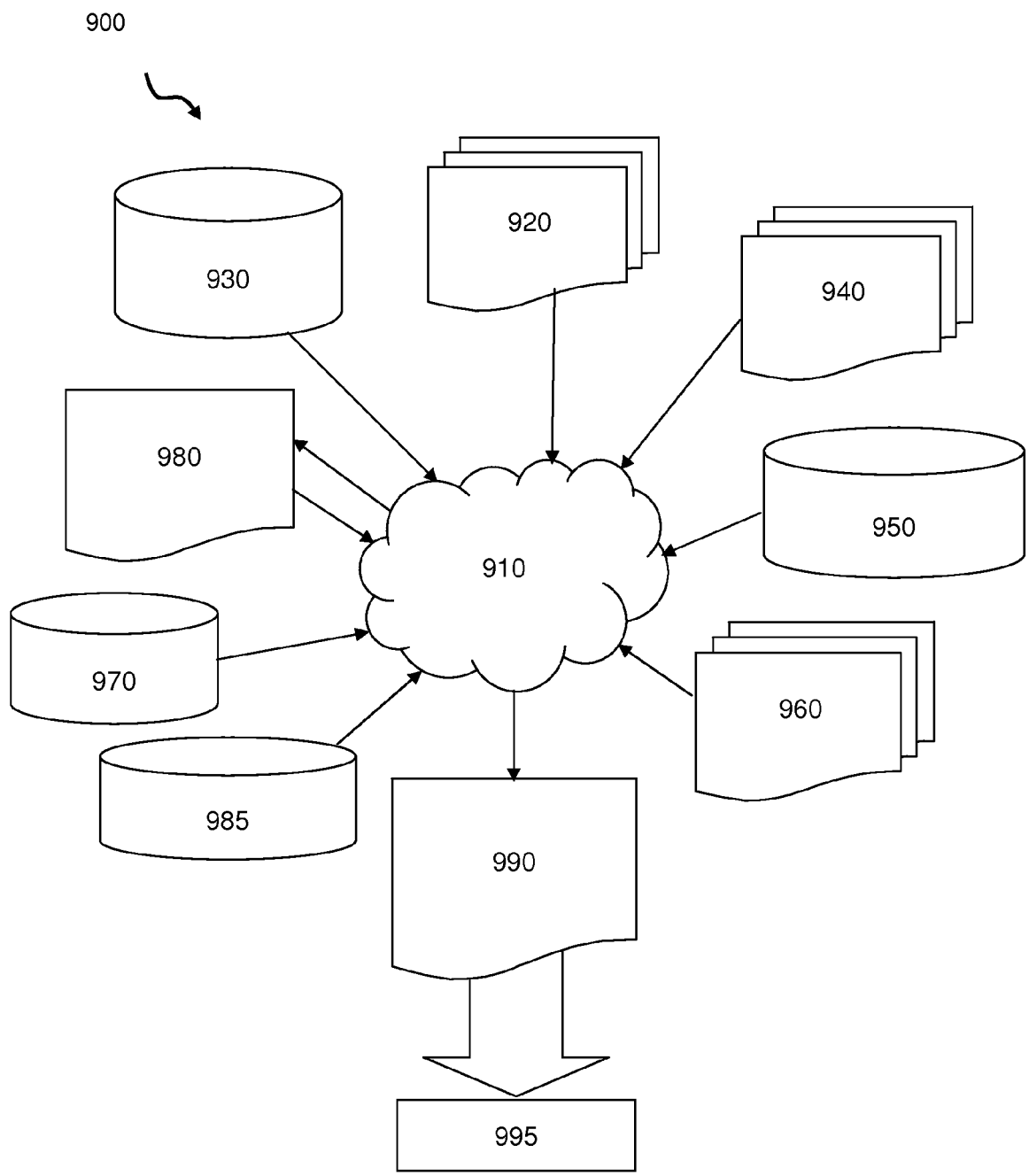
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming at least one layer of Si material on a substrate;
   forming at least one layer of carbon based material adjacent to the at least one layer of Si;
   patterning at least one of the at least one layer of Si material and the at least one layer of carbon based material to form at least one vertical stack of alternating Si and carbon based material; and
   forming graphene on the patterned carbon based material.

2. The method of claim 1, wherein the carbon based material is SiC material.

3. The method of claim 2, wherein the forming of the graphene comprises an annealing step.

4. The method of claim 3, wherein the annealing step comprises an anneal of about 1150° C. to about 1400° C. for about 30 to 300 minutes.

5. The method of claim 3, wherein the graphene is a mono layer of a graphene nanoribbon formed about each layer of the SiC material.

6. The method of claim 2, wherein:
   the forming at least one layer of Si material is multiple layers;
   the forming at least one layer of SiC material is multiple layers;
   the multiple layers of Si material and SiC material are alternately stacked; and
   the patterning of the alternating layers of the Si material and SiC material form one or more fin stacks.

7. The method of claim 6, wherein a size of the graphene nanoribbons are based on a thickness of the SiC material in the one or more fin stacks.

8. The method of claim 7, wherein the at least one layer of SiC material has a thickness of about 0.5 nm to 5 nm.

9. The method of claim 6, further comprising forming one or more gate structures on the one or more fin stacks with graphene nanoribbons.

10. A method, comprising:
    forming at least one layer of Si material on a substrate;
    forming at least one layer of carbon based material adjacent to the at least one layer of Si;
    patterning at least one of the at least one layer of Si material and the at least one layer of carbon based material; and
    forming graphene on the patterned carbon based material, wherein:
      the carbon based material is SiC material;
      the patterning comprises forming trenches within the at least one layer of Si material; and
      the method further comprises:
        depositing the SiC material within the trenches, thereby forming alternate layers of SiC material and Si material.

11. A method, comprising:
    forming alternating layers of Si material and SiC material over a substrate;
    patterning the alternating layers of Si material and SiC material into one or more fin stacks; and
    forming graphene nanoribbons about the SiC material of the fin stacks by annealing at a predetermined annealing temperature and time, wherein:

the alternating layers of Si material and SiC material comprise plural layers of the Si material and plural layers of the SiC material;

the patterning comprises etching the plural layers of the Si material and the plural layers of the SiC material; and the patterning forms trenches in the plural layers of the Si material and the plural layers of the SiC material, such that adjacent ones of the fin stacks are separated by one of the trenches.

12. The method of claim 11, wherein the predetermined annealing temperature and time is about 1150° C. to about 1400° C. for about 30 to 300 minutes.

13. The method of claim 12, wherein the graphene nanoribbons is a mono layer of graphene about each of the layers of SiC material.

14. The method of claim 12, further comprising forming one or more gate structures on the one or more fin stacks with graphene nanoribbons.

15. The method of claim 12, wherein the patterning is a sidewall image transfer process.

16. The method of claim 12, wherein the alternating layers of Si material and SiC material are at least two layers each of Si material and SiC material.

17. The method of claim 11, wherein each layer of SiC material has a thickness of about 0.5 nm to 5 nm.

18. The method of claim 17, wherein each layer of SiC material has a thickness of about 1 nm to 5 nm.

19. The method of claim 18, wherein each layer of SiC material has a thickness of about 2 nm to 3 nm.

\* \* \* \* \*